United States Patent
Chung et al.

[11] Patent Number: 5,930,650
[45] Date of Patent: Jul. 27, 1999

[54] METHOD OF ETCHING SILICON MATERIALS

[76] Inventors: Bryan Chaeyoo Chung, 4346 Lenox Dr., Bethlehem; Charles Walter Pearce, 410 S. 12th St., Emmaus, both of Pa. 18049

[21] Appl. No.: 08/904,527

[22] Filed: Aug. 1, 1997

[51] Int. Cl.$^6$ .................................................. H01L 21/76
[52] U.S. Cl. ............................. 438/448; 438/753; 216/99
[58] Field of Search ................................. 438/448, 753, 438/FOR 131, FOR 229, FOR 393; 216/2, 99; 252/79.2

[56] References Cited

U.S. PATENT DOCUMENTS

| | | | |
|---|---|---|---|
| 5,215,930 | 6/1993 | Lee et al. | 437/40 |
| 5,607,543 | 3/1997 | Eisenberg et al. | 156/662.1 |

OTHER PUBLICATIONS

Pearce C.W. et al, "The Use of Metal Additions to Phosphoric Acid to Etch Polysilicon in Poly Buffered LOCOS Process", Science and Technology of Semiconductor Surface Preparation, Symposium pp. 459–464, Apr. 1997.

"A New Preferential Etch For Defects In Silicon Crystals", M. W. Jenkins, J. Electrochem. Soc., Solid–State Science and Technology, p.757, May 1997.

"MEMC Etch—A Chronium Trioxide—Free Etchant for Delineating Dislocations and Slip In Silicon", T.C. Chandler, J. Electrochemical Soc., Solid–State Science and Technology, p. 945, Mar. 1990.

"Polysilicon Emitter Bipolar Transistors", Ed. A. K. Kapoor and D. J. Roulston, IEEE J. Solid–State Circuit, 1997.

"Defect Delineation and Junction Staining Techniques for Silicon Using Wet Chemistry", C. W. Pearce, Invited Paper at The Electrochemical Society, Oct. 1991.

"High–Performance Transistors With Arsenic–Implanted Polysil Emitters", Jurgen Graul, Andreas Glasl, and Helmuth Murrmann, IEEE J. Solid–State Circuits, vol. SC–11, pp. 491–495, Aug. 1976.

*Primary Examiner*—George Fourson
*Attorney, Agent, or Firm*—Anthony Grillo

[57] ABSTRACT

Semiconductor integrated circuit processing is facilitated by an etch process illustratively applied to polysilicon and silicon nitride removal. The etch process illustratively comprises of the use of phosphoric acid with metal-containing additives to bring about an enhanced silicon etch rate effect.

25 Claims, 2 Drawing Sheets

METHOD OF ETCHING SILICON MATERIALS

TECHNICAL FIELD

This invention relates to wet etching of silicon materials such as polysilicon, amorphous silicon or silicon containing other dopants.

BACKGROUND OF THE INVENTION

In silicon semiconductor device fabrication, chemical removal of polysilicon or amorphous silicon and silicon nitride layers can be performed using both wet and dry etching techniques. Dry etching is especially well-suited for precise linewidth and profile control in Very Large Scale Integrated Circuit (VLSI) processing and nanostructure fabrication. However, wet etching still plays an important role where linesize or profile control is not critical, or where the removal of a blanket film is required. For such applications, wet etching can offer advantages of high etch rate combined with high selectivity to dissimilar material layers, while avoiding the problem of plasma or radiation damage that may be present in dry etching techniques.

In silicon metal-oxide semiconductor (MOS) integrated circuit (IC) fabrication, polysilicon is used at different levels such as gate and interconnect. It is also used as a buffer layer for stress relief during the poly-buffered local oxidation of silicon (PBL) process. The PBL process is used at an early stage of silicon device fabrication to form silicon oxide regions which can act as isolation oxide. Briefly, the PBL process proceeds as follows. After a thin oxide layer is formed over a silicon substrate, a polysilicon layer is deposited, followed by a silicon nitride layer. The combined nitride and polysilicon layers, sometimes referred to as a nitride/poly stack, are then patterned using photolithography and etching techniques which are well known in the semiconductor industry. With the patterned nitride/poly stack acting as a mask, oxidation is performed to produce field oxide regions over the silicon substrate. This nitride/poly stack generally needs to be removed prior to subsequent processing. Existing techniques employ either a combination of wet and dry etching, or wet etching alone. In the wet/dry combination, for example, silicon nitride can be removed in a hot acid bath followed by dry etching of the polysilicon layer. Typical plasma etching, however, may cause damage to the underlying oxide and substrate. Such damage can be minimized by wet etching to remove both nitride and polysilicon layers.

In an existing PBL process, a 2-step procedure can be used for the removal of the nitride/poly stack. Hot phosphoric acid ($H_3PO_4$) may be used for removing the nitride layer, followed by dry etching of polysilicon. Alternatively, the polysilicon may be removed by using a phosphoric and nitric acid mixture ($H_3PO_4/HNO_3$).

Those skilled in the semiconductor art often try to simplify existing processing steps. An alternative to the process described above may be a one-step procedure for removing the nitride and silicon etch control without sacrificing the high selectivity to dissimilar materials, such as silicon oxide.

Many different liquid etchants have been used in the field of IC processing. Hydrofluoric acid (HF), nitric acid ($HNO_3$), or potassium hydroxide (KOH) are such examples, but their oxide etch rates may be too high for certain applications.

Other variations include the MEMC [J. Electrochem. Soc.: Solid-State Sci. and Tech., p. 945, March 1990] and Wright-Jenkins [J. Electrochem. Soc.: Solid-State Sci. and Tech., p. 757, May 1977] formulations, where copper is added as a catalyst to different acid mixtures. The MEMC etch is used for the characterization of silicon defects. It contains copper nitrate ($Cu(NO_3)_2$) in an aqueous mixture of $HF, HNO_3$ and acetic acid ($CH_3COOH$). The Wright-Jenkins mixture shows a preferential etch for (100)- and (111)- oriented, p- and n-doped silicon. It contains chromic oxide ($CrO_3$), in addition to $HF, HNO_3$, $CH_3COOH$, $H_2O$ and $Cu(NO_3)NO_3$

SUMMARY OF THE INVENTION

The present invention involves a method of etching polysilicon, amorphous silicon, or silicon containing other dopants, with high selectivity to silicon oxide. The presence of a certain minimum amount of metal-containing species in a $H_3PO_4/HNO_3$ acid bath enhances the etch rate of polysilicon or amorphous silicon compared to that from the $H_3PO_4$ alone. The choice of this amount of metal-containing species depends on the exact conditions of the acid bath, and the etch rates that are appropriate for specific applications. The invention also offers an advantage of a relatively slow silicon oxide etch rate, such that any oxide material that is present is not significantly removed during the etching of the silicon materials.

DETAILED DESCRIPTION

Figure 1:
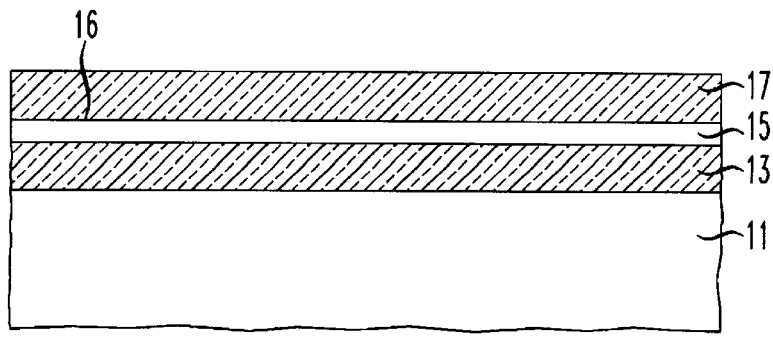
FIGS. 1—6 are cross-sectional views that are useful in describing the illustrative embodiments of the invention.

FIG. 1 illustrates a structure during an early stage of a silicon MOS device fabrication sequence employing the PBL process. It starts with the formation of a silicon oxide layer (13), often called pad oxide, over a silicon wafer substrate (11). A polysilicon layer (15) is then deposited using conventional techniques such as low pressure chemical vapor deposition (LPCVD) at a temperature of about 600° C. Alternatively, amorphous silicon may be used instead of polysilicon, and may indeed be preferred for some applications.

The polysilicon surface (16) is cleaned in a HF bath to remove any thin oxide from the polysilicon surface. This cleaning step will facilitate the wet etching of polysilicon at some later stage. Silicon nitride material (17) is then deposited over the polysilicon material using LPCVD at a temperature of 800°–900° C. The nitride (17) and polysilicon (15) layers can subsequently be patterned using lithographic and etching methods that are well known to one skilled in the art, resulting in a structure shown illustratively in FIG. 2. The combined silicon nitride and polysilicon structure is often referred to as a nitride/poly stack (19). A range of thicknesses can be used for the various layers, depending on the specific applications.

Figure 2:
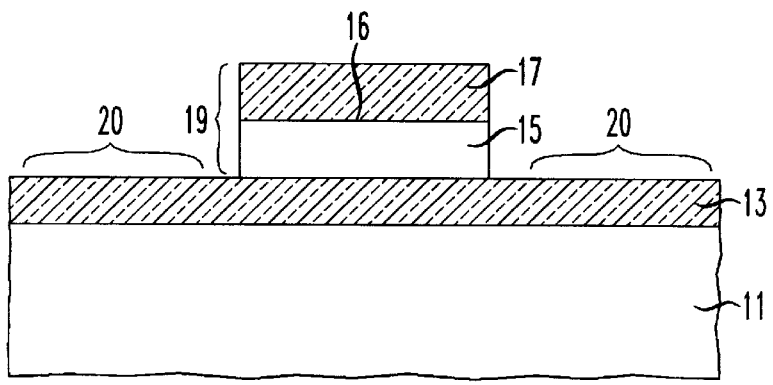
Figure 3:
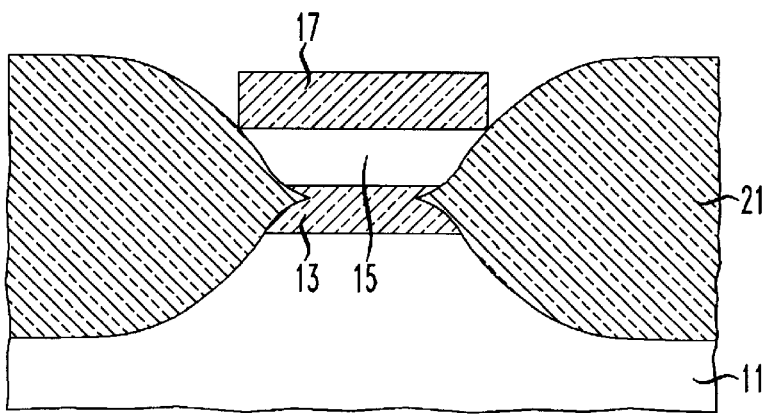

The structure illustrated in FIG. 2 is then subjected to an oxidation process, where the nitride/poly stack acts as an oxidation mask —i.e., oxidation takes place primarily in regions where nitride and polysilicon layers have previously been removed, such as areas labeled (20). This oxidation can be performed under steam, dry, or high pressure conditions, and results in the formation of thicker silicon oxide regions commonly known as field oxide (21), as shown in FIG. 3. In general, steam oxidation proceeds at a faster rate than dry oxidation, and offers better process control than high pressure oxidation. Removal of the nitride/poly stack (19) is often desirable prior to subsequent IC processing. In order to preserve the integrity and thickness of both field oxide (21) and pad oxide (13) during the stack (19) removal step, an etch process offering a high selectivity between polysilicon and oxide is needed.

Illustratively, in accordance with this invention, the structure in FIG. 3 can be etched in a hot phosphoric acid bath, to which a metal-containing species have been added. Such an additive may be any appropriate metal-containing species which can undergo a reduction-oxidation reaction with silicon. It is preferable that this metal-containing species not result in particulates or precipitates in the acid bath. The additive should be present in a sufficient amount effective in providing an enhanced etch rate for polysilicon or amorphous silicon, without causing a significant loss of oxide material. The oxide loss which is considered insignificant depends, of course, on the specific application and is determined by the material thicknesses and the oxide etch rate relative to that of polysilicon or amorphous silicon. For a typical PBL application, a selectivity (the ratio of polysilicon or amorphous silicon etch rate, to that of oxide), of at least 20:1 is desirable. A selectivity of 10:1 may suffice for other applications with a less stringent requirement for oxide loss.

In one embodiment, copper chloride is added to a hot concentrated (14.6M) phosphoric acid bath at a temperature of 163°–167° C. At a concentration of 60 ppm of $Cu^{+2}$, an etch rate of 20 Å/min. is obtained for undoped polysilicon. This is a 4-fold enhancement of the 5 Å/min. etch rate for $H_3PO_4$ alone. This $Cu^{+2}$ enhanced etch rate is comparable to that of 18 Å/min. obtained from the previously mentioned $H_3PO_4/HNO_3$(70%) mixture under a similar temperature condition. The oxide etch rate from the $Cu^{+2}/H_3PO_4$ bath is also acceptably low for our application—less than 1 Å/min. Other copper compounds such as copper sulfate and copper oxide are also effective in enhancing the polysilicon etch rate. Illustratively, a temperature between 155° C. and 185° C. is expected to yield reasonable etch rates and selectivities for stack (19) removal applications. Of course, temperatures outside of this range may be used, depending on the specific process requirements. In general, higher temperatures tend to lead to higher etch rates. Proper adjustments of other processing conditions such as concentrations of metal-containing species and $H_3PO_4$ may be necessary along with a change in the bath temperature. These adjustments can readily be achieved by one skilled in the art.

Experimental data show that at a temperature of 163°–165° C., a minimum of 10 ppm of $Cu^{+2}$ additive is needed to yield an observable enhanced etch rate over that of $H_3PO_4$ alone. Etch rate data for other metal additives are shown in Table I for concentrations ranging from 10–150 ppm. Some additives are more effective in bringing about enhanced polysilicon etch rates than others. In general, it is expected that ionic species which are capable of participating in a reduction-oxidation reaction with silicon will lead to enhanced silicon etch rate. For example, those species with reduction potentials which are more positive than silicon are likely to exhibit this enhanced silicon etch rate effect. While the use of chemical potentials provides a general guideline in identifying other viable candidates, some deviation from this trend may occur on a case-by-case basis, depending on the reaction kinetics, material thicknesses and specific experimental conditions involved. Experimental adjustments necessary for individual, specific additives can readily be performed by one skilled in the art. Of course, another requirement for the PBL application is that oxide layers that are present should not be significantly removed by the etchant. Under the conditions described above, the oxide etch rates for the 60 ppm $Cu^{+2}$ and 150 ppm $Fe^{+3}$ samples are both less than 1 Å/min., which is well within the required range to avoid excess oxide loss or substrate damage.

TABLE I

Polysilicon Etch Rates in $H_3PO_4$

| Temperature (°C.) | Additives* | Concentration (ppm) | Etch Rate (Å/min.) |
|---|---|---|---|
| 163–167 | — | — | 5 |
| 162–165 | $HNO_3$ | 10000 | 18 |
| 163–165 | $Cu^{+2}$ | 1 | 2 |
| 163–165 | $Cu^{+2}$ | 10 | 9 |
| 163–165 | $Cu^{+2}$ | 60 | 20 |
| 163–169 | $Cu^{+2}$ | 60 | 24 |
| 165–167 | $Fe^{+3}$ | 1 | 2 |
| 163–165 | $Fe^{+3}$ | 10 | 6 |
| 163–166 | $Fe^{+3}$ | 150 | 25 |
| 163–167 | $Zn^{+2}$ | 50 | 6 |
| 162–167 | $Ni^{+2}$ | 50 | 9 |
| 162–168 | $As^{+3}$ | 50 | 12 |
| 163–170 | $Sb^{+3}$ | 50 | 41 |

*The additives are listed as metallic ions in their respective oxidation states for the added compounds. It is understood that other oxidation states of these ions may exist in the acid bath as reaction progresses, depending on the specific reaction kinetics. The listing of these specific oxidation states is not meant to be a limitation on the metal-containing additive of this invention.

Figure 4:
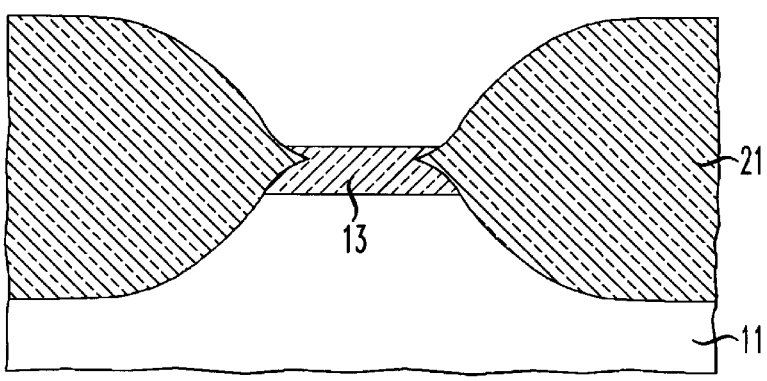

After the above etching step, the resulting structure, illustrated in FIG. 4, is subjected to a post-etch cleaning step to remove any metal-containing species that may remain on the surface of the oxide or silicon substrate. Various clean/rinse procedures have been attempted, including cold water rinsing, and assorted cleans under different temperature, chemical or physical conditions. The cleanliness of the oxide surface is monitored using the Total X-ray Reflectance Fluorescence technique, and compared to a control sample that has not been exposed to such wet etch mixtures with metal-containing additives. Results indicate that neither cold nor hot (60° C.) water rinsing alone is effective in removing the metallic ion species remaining on the surface after this wet etch process. By contrast, either a SC-2 (mixture of hydrochloric acid, hydrogen peroxide, and water) with high frequency, e.g., MHz, agitation or sulfuric acid/hydrogen peroxide mixture proves effective in reducing the Fe-containing residues to a level comparable to that of the control sample. Subsequent processing can then proceed as needed for the desirable device.

Figure 5:
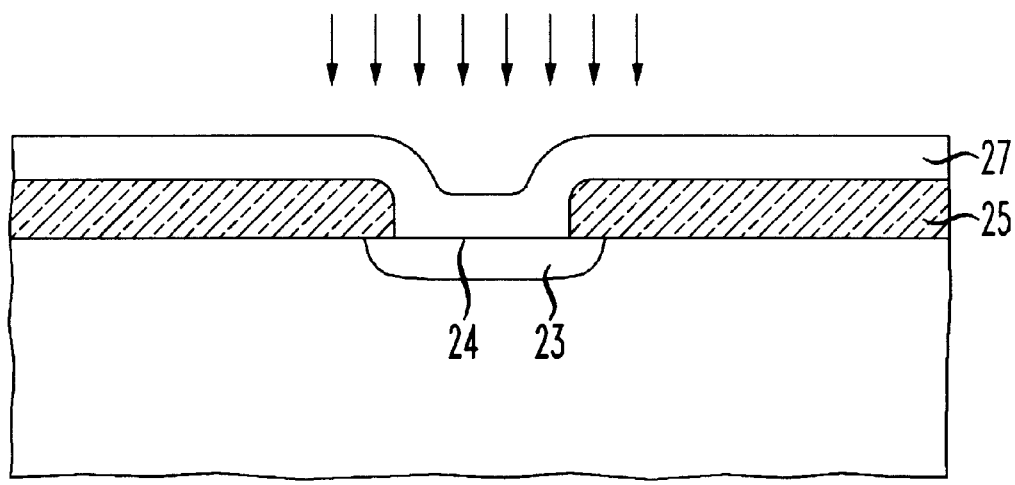
Figure 6:
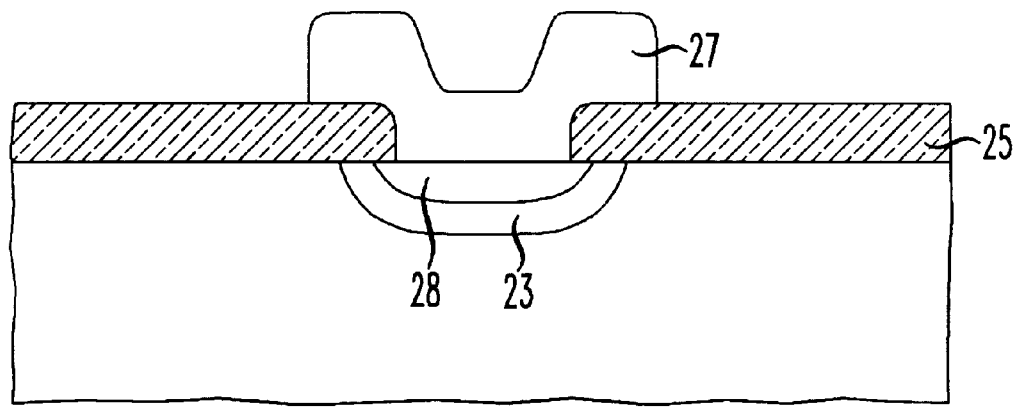

This invention can also be applied to the formation of emitter or base in bipolar devices, where polysilicon may be used. FIG. 5 illustrates a cross-sectional view of a polysilicon emitter process, where emitter windows (24) have been opened to the monocrystalline base region (23) in an oxide layer (25), followed by polysilicon (27) deposition using techniques similar to those in MOS processing. [Polysilicon Emitter Bipolar Transistor, Ed. A. K. Kapoor and D. J. Roulston, IEEE J. Solid-State Circuits, p.62, 1976.] The processing steps leading to the structure shown in FIG. 5 are well known to those skilled in the art. Emitter implantation, e.g., arsenic doping at 100 keV and a dose of $10^5$–$10^6$ $cm^{-2}$, can then be performed followed by dopant diffusion at a temperature range of 900°–1000° C. After suitable lithographic steps, the polysilicon emitter can be etched using the metal-added $H_3PO_4$ of this invention, without removing any significant amount of the oxide material. In general, doped polysilicon is expected to have an etch rate higher than that of undoped polysilicon, leading to an even higher etch selectivity between the polysilicon and oxide materials. The resulting structure, with the polysilicon emitter and a diffused base region (28) is illustratively shown in FIG. 6.

Appropriate metal contacts can subsequently be formed using conventional bipolar processing steps. This invention can also be applied to base formation where boron-doped polysilicon is used. In other bipolar applications where silicon-germanium alloys are involved, the metal-added $H_3PO_4$ is expected to yield similarly efficient etches for silicon-germanium, while providing the required low oxide etch rate. Again, a comparison between the electrochemical potentials of germanium and those of other metals will help in identifying viable metal additives not specifically listed in Table I. In this context, silicon-germanium can be considered a variation of silicon containing germanium as a dopant.

Although description of this invention has primarily been focused on the PBL process in silicon MOS fabrication, the general applicability of this method to other devices or processes cannot be over-emphasized. The application of this etch process to a nitride/poly stack (19) is meant to be illustrative only, and is not intended as an inherent limitation of the invention's applicability. The metal-added $H_3PO_4$ bath can be used to etch either polysilicon, amorphous silicon, or silicon containing other dopants by itself, as illustrated in the polysilicon emitter process for a bipolar device. Under certain circumstances, wet etching using the present invention may be more desirable than other liquid etchants, or dry etching. Illustratively, applications where the etched profile of the polysilicon or amorphous silicon is not critical, e.g., with very thin material layers, such a technique offers the advantage of a relatively high silicon etch rate with good selectivity to silicon oxide. Potential damage to exposed oxide regions can easily be avoided. Although the invention has been described with respect to embodiments directed to IC fabrication, other embodiments directed to applications in micromachining, nanostructure fabrication, or other coating-related processes are also contemplated.

The invention claimed is:

1. A method of etching a first material upon a substrate, the first material being chosen from the group of amorphous silicon, polysilicon and silicon containing other dopants, comprising:
    removing at least a portion of the first material using phosphoric acid; wherein:
    the phosphoric acid has at least an effective amount of metal-containing species present so as to remove the first material at an etch rate higher than that from phosphoric acid alone;
    the substrate has at least a second material upon it, and
    the second material is not significantly removed by the phosphoric acid.

2. A method of etching a plurality of silicon-containing material layers from a substrate, comprising:
    removing at least a portion from the plurality of the silicon-containing material layers using phosphoric acid; wherein
    the phosphoric acid has at least an effective amount of metal-containing species present such that the etch rate of at least one silicon-containing material layer is higher than that from phosphoric acid alone; and
    the substrate has a second material upon it which is different from the plurality of silicon-containing material layers and is not significantly removed by the phosphoric acid.

3. A method as in claim 1, wherein the second material is an oxide.

4. A method of semiconductor integrated circuit fabrication, comprising:
    forming a material layer overlying a substrate;
    the material being chosen from the group consisting of amorphous silicon, polysilicon and silicon containing other dopants;
    forming a silicon nitride layer upon the material layer;
    removing the silicon nitride layer and the material layer with phosphoric acid, wherein
    the phosphoric acid has at least an effective amount of metal-containing species added to attain etch rate of the material layer which is higher than that obtained from phosphoric acid alone; and
    the substrate is not significantly removed by the phosphoric acid.

5. A method of semiconductor integrated circuit fabrication, comprising:
    forming an oxide layer upon a silicon substrate;
    forming a material layer upon the oxide layer;
    the material being chosen from the group consisting of amorphous silicon, polysilicon and silicon containing other dopants;
    forming a nitride layer upon the material layer;
    forming a field oxide; and
    removing the material layer and the nitride layer with phosphoric acid to expose the oxide layer; wherein
    the phosphoric acid has at least an effective amount of metal-containing species added so as to attain an etch rate of the material layer which is higher than that from phosphoric acid alone.

6. A method of semiconductor integrated circuit fabrication, comprising:
    forming a material layer overlying an oxide layer;
    the material being chosen from the group consisting of amorphous silicon and polysilicon and silicon containing other dopants;
    forming a silicon nitride layer upon the material layer; and
    removing the silicon nitride layer and at least a portion of the material layer with phosphoric acid; wherein
    the phosphoric acid has at least an effective amount of metal-containing species present so as to attain an etch rate of the material layer which is higher than that from phosphoric acid alone.

7. The method as in claim 5, further comprising:
    removing the oxide layer to expose the silicon substrate; and
    forming at least one transistor in the silicon substrate.

8. A method as in claim 4, where the metal in the metal-containing species is copper present in an amount at least equal to 10 ppm.

9. A method according to claim 4, where the metal in the metal-containing species is antimony present in an amount at least equal to 50 ppm.

10. A method according to claim 4, where the metal in the metal-containing species is iron present in an amount at least equal to 10 ppm.

11. A method according to claim 4, where the metal in the metal-containing species is arsenic present in an amount at least equal to 50 ppm.

12. A method according to claim 4, where the metal in the metal-containing species is nickel present in an amount at least equal to 50 ppm.

13. A method according to claim 4, where the metal-containing species is chosen from the group of chloride, sulfate and oxide compounds.

14. A method as in claim 4, where the metal in the metal-containing species is capable of undergoing a reduction-oxidation reaction with silicon in the phosphoric acid.

15. A method of thin film processing, comprising:

forming a material over an oxide layer;

the material being chosen from the group of amorphous silicon, polysilicon and silicon containing other dopants; and removing at least a portion of the material layer with phosphoric acid; wherein the phosphoric acid has at least an effective amount of metal-containing species present so as to attain an etch rate of the material layer which is higher than that from phosphoric acid alone.

16. A method of thin film processing, comprising:

forming adjacent layers of silicon nitride and a material chosen from the group of amorphous silicon, polysilicon and silicon containing other dopants;

these adjacent layers being formed over an oxide layer;

removing the silicon nitride layer and at least a portion of the material layer with phosphoric acid; wherein:

the phosphoric acid has at least an effective amount of metal-containing species added so as to attain an etch rate of the material layer which is higher than that from phosphoric acid alone.

17. A method as in claim 15, wherein the oxide layer is not significantly removed by the phosphoric acid.

18. A method as in claim 1, wherein the phosphoric acid is at a temperature substantially between 155° C. and 185° C.

19. A method as in claim 4, wherein the phosphoric acid is at a temperature substantially between 155° C. and 185° C.

20. A method as in claim 15, wherein the phosphoric acid is at a temperature substantially between 155° C. and 185° C.

21. A method as in claim 18, wherein the effective amount of the metal present in the phosphoric acid is at least 10 ppm.

22. A method as in claim 1, further comprising a cleaning step after the removal of the material layer using the phosphoric acid.

23. A method as in claim 4, further comprising a cleaning step after the removal of the material layer using the phosphoric acid.

24. A method as in claim 23, wherein the cleaning step comprises a high frequency agitation in a mixture of hydrochloric acid, hydrogen peroxide and water.

25. A method as in claim 23, wherein a sulfuric acid/hydrogen peroxide mixture is used in the cleaning step.

* * * * *